United States Patent
Chuang

(10) Patent No.: US 7,907,013 B2
(45) Date of Patent: Mar. 15, 2011

(54) CLASS AB OUTPUT STAGE WITH PROGRAMMABLE BIAS POINT CONTROL

(75) Inventor: Chao-Hsuan Chuang, Jhubei (TW)

(73) Assignee: Richtek Technology Corp., Hsinchu (TW)

( * ) Notice: Subject to any disclaimer, the term of this patent is extended or adjusted under 35 U.S.C. 154(b) by 72 days.

(21) Appl. No.: 12/385,985

(22) Filed: Apr. 27, 2009

(65) Prior Publication Data

US 2009/0267695 A1 Oct. 29, 2009

(30) Foreign Application Priority Data

Apr. 29, 2008 (TW) ................ 97115717 A

(51) Int. Cl.
*H03F 3/26* (2006.01)
(52) U.S. Cl. ....................................... 330/267
(58) Field of Classification Search .............. 330/255, 330/264, 267; 327/333
See application file for complete search history.

(56) References Cited

U.S. PATENT DOCUMENTS 6,005,440 A * 12/1999 Okamoto .............. 330/253
7,145,393 B1 * 12/2006 Lubbers ............... 330/264
* cited by examiner

*Primary Examiner* — Steven J Mottola
(74) *Attorney, Agent, or Firm* — Rosenberg, Klein & Lee

(57) ABSTRACT

A class AB output stage includes a driver to generate a first drive signal and a second drive signal, and two bias voltage sources to provide two bias voltages to level shift the first and second drive signals, in order to drive a pair of high side and low side transistors, respectively. A control circuit provides a control signal to adjust the first and second bias voltages, so as to shift the bias point of the class AB output stage. The control signal is determined according to the currents in the high side and low side transistors and a programmable parameter. By adjusting the parameter, the bias point deviation can be removed to obtain both low quiescent current and best THD performance.

12 Claims, 4 Drawing Sheets

CLASS AB OUTPUT STAGE WITH PROGRAMMABLE BIAS POINT CONTROL

FIELD OF THE INVENTION

The present invention is related generally to a class AB output stage and, more particularly, to the bias point control of a class AB output stage.

BACKGROUND OF THE INVENTION

Conventionally, a class AB output stage is used to drive big MOS transistors in power applications. As shown in FIG. 1, a typical class AB output stage 10 includes a driver 12 to provide two drive signals UH and UL, and two bias voltage sources 16 and 18 to provide bias voltages VOS1 and VOS2, respectively, which are used to level shift the drive signals UH and UL to produce the gate voltages for driving a pair of high side transistor MP and low side transistor MN serially connected between a power supply Vcc and a ground terminal GND, in order to supply a current for a load RL connected to an output LX. Typically, the driver 12 uses an operational amplifier 14 to produce the drive signals UH and UL according to an input signal Vin and a feedback signal from the output LX. The bias voltages VOS1 and VOS2 are the key to the quiescent current control and total harmonic distortion (THD) of this circuit. The quiescent current refers to the current consumed by this circuit from the power supply Vcc under loadless condition, i.e., without the load RL. For driving a resistive load RL, there are many factors, including crossover distortion, power consumption through the big MOS paths and loop stability, must be taken into consideration at the same time for the design of the class AB output stage 10. The target of the design region is shown in FIG. 2, in which the X-axis represents the bias voltages VOS1 and VOS2, the left Y-axis represents the THD, the right Y-axis represents the quiescent current IQ, the curve 20 represents the relationship between the THD and the bias voltages VOS1 and VOS2, and the curve 22 represents the relationship between the quiescent current IQ and the bias voltages VOS1 and VOS2. As shown by the curves 20 and 22, as the bias voltages VOS1 and VOS2 increase, the THD decreases whereas the quiescent current IQ increases; contrarily, for smaller quiescent current IQ, the THD is greater. A dash circle 24 marks the ideal design region of the bias voltages VOS1 and VOS2, where it may have lower quiescent current IQ and better THD performance at the same time. However, this design region 24 is quite sensitive to process variation and as a result, the bias voltages VOS1 and VOS2 may deviate from the design region 24 due to the process variation in real applications. Therefore, solutions are needed for the bias voltages VOS1 and VOS2 to return to the target design region 24 against process variation.

U.S. Pat. No. 5,481,213 to Johnson has proposed a cross-conduction prevention circuit for power amplifier output stage, which may get a best THD performance and a reasonable quiescent current if the width/length size of some MOS transistors in a fill-in circuit is well designed. However, this solution requires adding the fill-in circuit and an extra control circuit into the output stage and thus results in a relatively complicated structure. Moreover, the fill-in circuit and the extra control circuit may be interfered by each other, thus leading to system instability. On the other hand, the bias point of this output stage is not programmable and thus cannot be adjusted to reduce or remove the error resulted from process variation.

Therefore, a simpler class AB output stage with programmable bias point control is desired.

SUMMARY OF THE INVENTION

An object of the present invention is to provide a class AB output stage with programmable bias point control.

Another object of the present invention is to provide a programmable bias point control method for a class AB output stage.

According to the present invention, to drive a pair of serially connected high side and low side transistors, a class AB output stage includes a driver to generate a first drive signal and a second drive signal, a first bias voltage source to provide a first bias voltage to level shift the first drive signal to thereby produce a level shifted first drive signal to drive the high side transistor, a second bias voltage source to provide a second bias voltage to level shift the second drive signal to thereby produce a level shifted second drive signal to drive the low side transistor, and a control circuit to provide a control signal to adjust the first and second bias voltages.

According to the present invention, for a class AB output stage to drive a pair of serially connected high side and low side transistors, a programmable bias point control method generates a first drive signal and a second drive signal, level shifts the first and second drive signals with a first bias voltage and a second bias voltage to produce a level shifted first drive signal and a level shifted second drive signal to drive the high side and low side transistors, respectively, and adjusts the first and second bias voltages with a control signal.

According to the present invention, the operation point of the class AB output stage will automatically return to a target operation region by the control signal adjusting the first and second bias voltages, and the bias point of the class AB output stage is programmable by setting a parameter in the control circuit.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
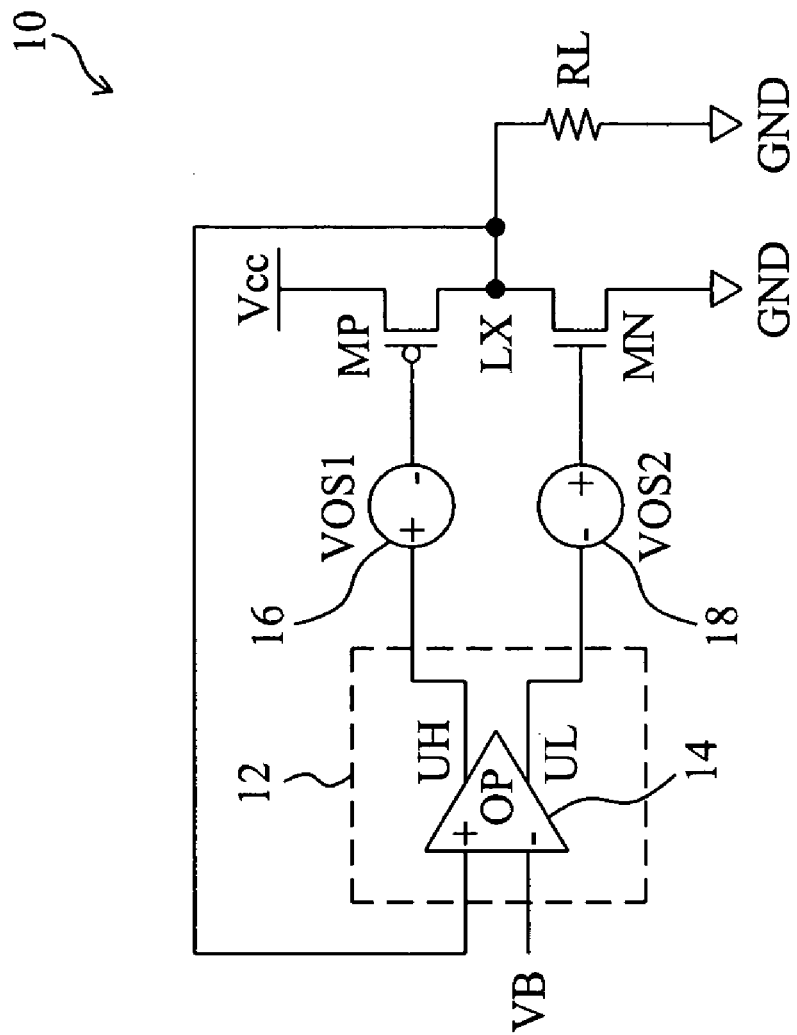
FIG. 1 is a circuit diagram of a typical class AB output stage.
Figure 2:
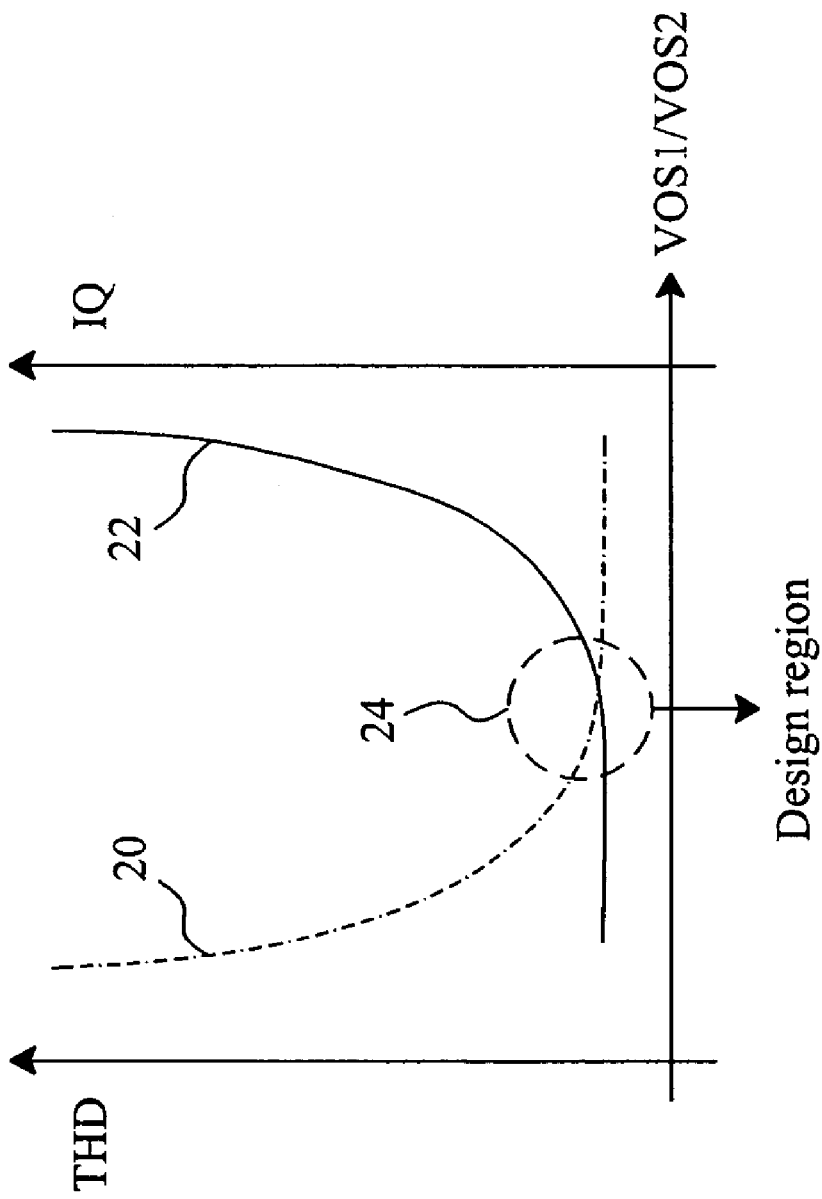
FIG. 2 is a schematic diagram showing the operation region of a conventional class AB output stage.
Figure 3:
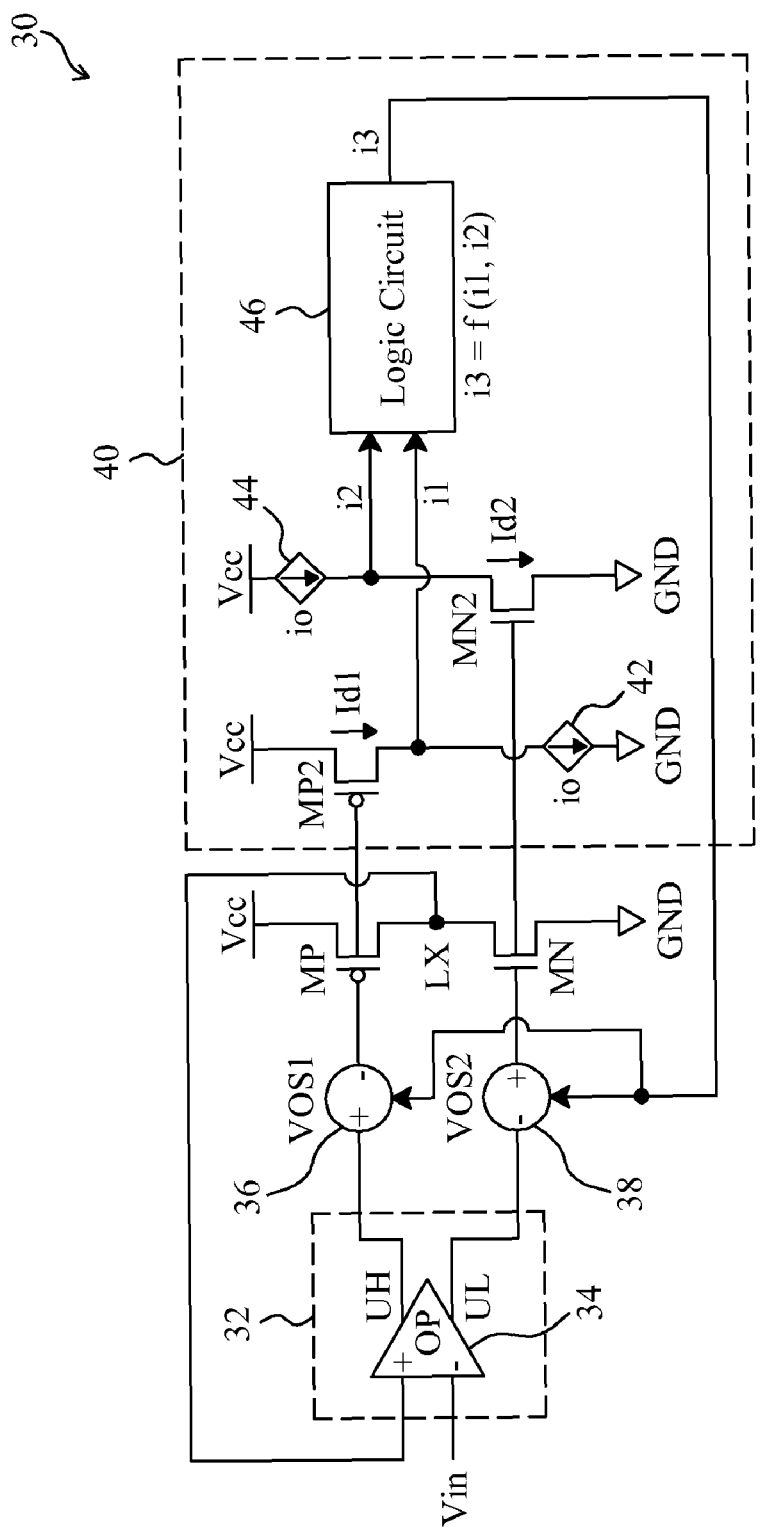
FIG. 3 is a circuit diagram of an embodiment according to the present invention.

An embodiment according to the present invention is shown in FIG. 3, in which a class AB output stage 30 includes a driver 32 to generate drive signals UH and UL, two controlled bias voltage sources 36 and 38 to provide adjustable bias voltages VOS1 and VOS2 to level shift the drive signals UH and UL, respectively, and a control circuit 40 to provide a control signal i3 to adjust the bias voltages VOS1 and VOS2, and the level shifted drive signals are then used to drive a pair of serially connected high side transistor MP and low side transistor MN, respectively, between a power supply Vcc and a ground terminal GND. The diver 32 includes an operational amplifier 34 which has two inputs to receive an input signal Vin and a feedback signal from the node LX, respectively, and two outputs to provide the opposite-in-phase drive signals UH and UL, respectively. In the control circuit 40, a transistor MP2 is common gated to the high side transistor MP to mirror the current therein to generate a current Id1, a transistor MN2 is common gated to the low side transistor MP to mirror the current therein to generate a current Id2, a controlled current source 42 providing a current io is serially connected to the transistor MP2, a controlled current source 44 providing a current io is serially connected to the transistor MN2, and a logic circuit 46 generates the control signal i3 according to the difference i1 between the currents Id1 and io and the difference i2 between the currents Id2 and io, i.e., i3 is a function of i1 and i2. The transistor MP2 is proportional to the high side transistor MP in size such that the current Id1 is proportional to the current in the high side transistor MP with a predetermined ratio therebetween. Likewise, the transistor MN2 is proportional to the low side transistor MN in size such that the current Id2 is proportional to the current in the low side transistor MP with a predetermined ratio therebetween. Both the currents io provided by the current sources 42 and 44 are externally adjustable.

Figure 4:
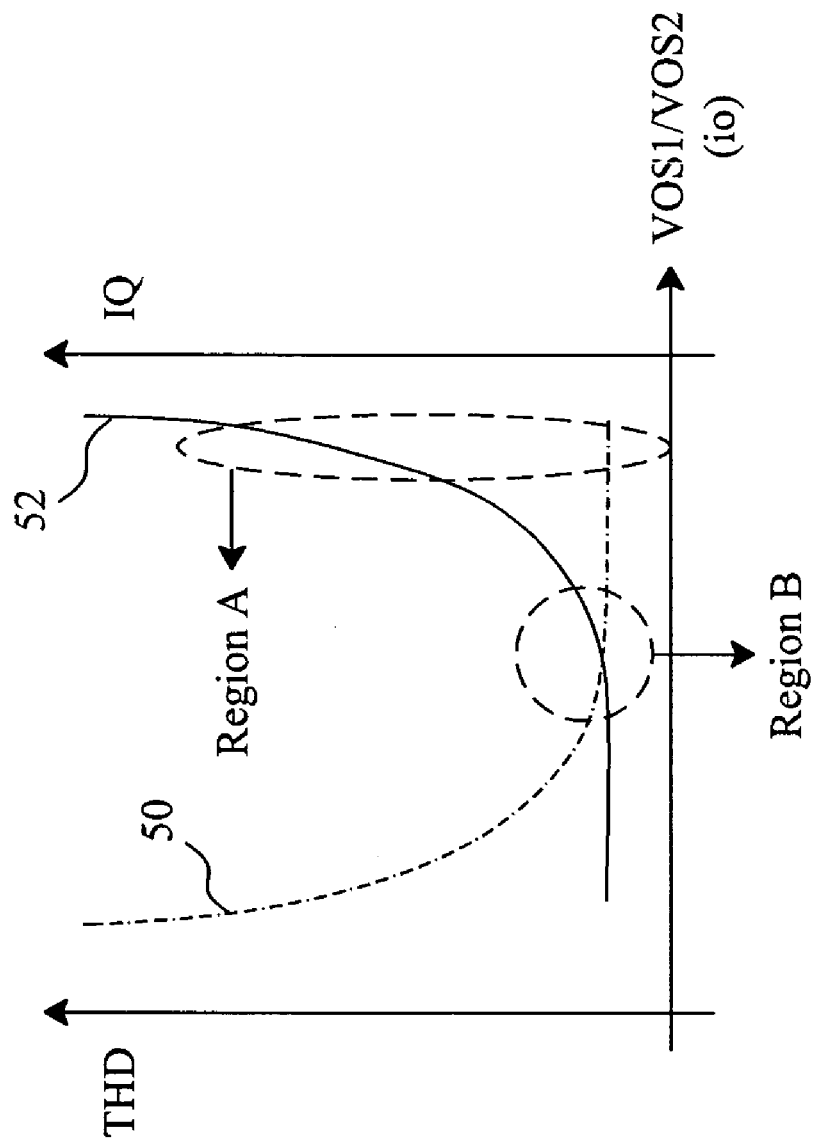
FIG. 4 is a schematic diagram showing the operation region of a class AB output stage according to the present invention.

FIG. 4 is a schematic diagram showing the operation region of the class AB output stage 30, in which the X-axis represents the bias voltages VOS1 and VOS2 or the currents io, the left Y-axis represents the THD, and the right Y-axis represents the quiescent current IQ, the curve 50 represents the relationship between the THD and the bias voltages VOS1 and VOS2, the curve 52 represents the relationship between the quiescent current IQ and the bias voltages VOS1 and VOS2, and the region B represents an ideal design region. The operation of the class AB output stage 30 is described by referring to FIGS. 3 and 4. It may greatly increase the quiescent current IQ of the high side transistor MP and low side transistor MN at first, by giving great bias voltages VOS1 and VOS2 provided by the bias voltage sources 36 and 38, in order to get better THD performance, where the operation point is in a region A to the right of the region B. In this case, it can be ensured that, even in the presence of process variation, the bias points are located to the right of the region B. However, the overlarge quiescent current IQ is not preferred. Thus, the currents io provided by the current sources 42 and 44 are adjusted in such a way that the bias points are shifted from the region A to the region B. The parameter io is programmable, and a larger io will lead to a larger quiescent current IQ but better THD performance. In a case, the logic circuit 46 selects between the differences i1 and i2, e.g., the smaller one thereof, as the control signal i3 to adjust the bias voltages VOS1 and VOS2 provided by the bias voltage sources 36 and 38.

If the differences i1 and i2 are both large, then i3 is large, and it will decrease the bias voltages VOS1 and VOS2 and thereby reduce the quiescent current IQ of the high side transistor MP and low side transistor MN. The ratio Id1/Id2 will also become smaller. Finally, i1, i2, io and i3 will reach a balance point. In other words, the bias point of the class AB output stage 30 is programmable by setting the currents io provided by the current sources 42 and 44. The above illustrates that the bias voltages VOS1 and VOS2 are set great at first to locate the bias point in a region A to the right of the region B. In another embodiment, it may set the bias voltages VOS1 and VOS2 small at first to locate the bias point in a region to the left of the region B, and then adjusts the parameter io to be smaller to shift the bias point to return to the region B.

By adjusting the parameter io, the class AB output stage 30 may adjust the bias voltages VOS1 and VOS2 to shift the bias point to the design region B. In particular, by setting the bias point in a higher region or a lower position at first, followed with adjusting the parameter io to shift the bias point, the process variation issue is removed. According to the present invention, only a control circuit 40 is added, without introducing circuit interference, it may remain system stability.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A class AB output stage with programmable bias point control for driving a pair of serially connected high side and low side transistors, comprising:
    a driver generating a first drive signal and a second drive signal;
    a first bias voltage source connected between the driver and the high side transistor, providing a first bias voltage to level shift the first drive signal to thereby produce a level shifted first drive signal to drive the high side transistor;
    a second bias voltage source connected between the driver and the low side transistor, providing a second bias voltage to level shift the second drive signal to thereby produce a level shifted second drive signal to drive the low side transistor; and
    a control circuit connected to the first and second bias voltage sources, providing a control signal to adjust the first and second bias voltages.

2. The class AB output stage of claim 1, wherein the driver comprises an operational amplifier having two inputs to receive two signals, respectively, and two outputs to provide the first and second drive signals, respectively.

3. The class AB output stage of claim 1, wherein the control circuit comprises:
    a first current source providing an adjustable first current;
    a second current source providing an adjustable second current;
    a third current source connected to the high side transistor, providing a third current in proportion to a current in the high side transistor;
    a fourth current source connected to the low side transistor, providing a fourth current in proportion to a current in the low side transistor; and
    a logic circuit connected to the first, second, third and fourth current sources, producing the control signal according to a first difference between the first and third currents and a second difference between the second and fourth currents.

4. The class AB output stage of claim 3, wherein the third current source comprises a transistor in proportion to the high side transistor in size and common gated to the high side transistor.

5. The class AB output stage of claim 3, wherein the fourth current source comprises a transistor in proportion to the low side transistor in size and common gated to the low side transistor.

6. The class AB output stage of claim 3, wherein the logic circuit selects one of the first and second differences as the control signal.

7. The class AB output stage of claim 3, wherein the logic circuit selects the smaller one of the first and second differences as the control signal.

8. A programmable bias point control method for a class AB output stage to drive a pair of serially connected high side and low side transistors, comprising the steps of:

generating a first drive signal and a second drive signal;

level shifting the first drive signal with a first bias voltage to produce a level shifted first drive signal to drive the high side transistor;

level shifting the second drive signal with a second bias voltage to produce a level shifted second drive signal to drive the low side transistor; and adjusting the first and second bias voltages with a control signal.

9. The programmable bias point control method of claim 8, wherein the step of generating a first drive signal and a second drive signal comprises operationally amplifying a difference between two signals to produce a pair of opposite-in-phase signals as the first and second drive signals, respectively.

10. The programmable bias point control method of claim 8, further comprising:

providing an adjustable first current and an adjustable second current;

providing a third current in proportion to a current in the high side transistor and a fourth current in proportion to a current in the low side transistor; and generating the control signal according to a first difference between the first and third currents and a second difference between the second and fourth currents.

11. The programmable bias point control method of claim 10, wherein the step of generating the control signal comprises selecting one of the first and second differences as the control signal.

12. The programmable bias point control method of claim 10, wherein the step of generating the control signal comprises selecting the smaller one of the first and second differences as the control signal.

* * * * *